(12) United States Patent
Carlson et al.

(10) Patent No.: US 9,513,412 B2
(45) Date of Patent: Dec. 6, 2016

(54) SYSTEMS AND METHODS FOR FABRICATING DISPLACEMENT SCALES

(75) Inventors: Daniel H. Carlson, Arden Hills, MN (US); Dale L. Ehnes, Cotati, CA (US); Daniel S. Wertz, Sebastopol, CA (US); Luis A. Aguirre, Austin, TX (US); Levent Biyikli, Cedar Park, TX (US); Alan B. Campbell, Oakdale, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 1309 days.

(21) Appl. No.: 12/664,561

(22) PCT Filed: Jun. 18, 2008

(86) PCT No.: PCT/US2008/067311
§ 371 (c)(1),
(2), (4) Date: Dec. 14, 2009

(87) PCT Pub. No.: WO2008/157588
PCT Pub. Date: Dec. 24, 2008

(65) Prior Publication Data
US 2010/0196607 A1    Aug. 5, 2010

Related U.S. Application Data

(60) Provisional application No. 60/944,890, filed on Jun. 19, 2007.

(51) Int. Cl.
*B05D 3/12* (2006.01)
*G02B 5/124* (2006.01)
(Continued)

(52) U.S. Cl.
CPC ........... *G02B 5/124* (2013.01); *G01D 5/34707* (2013.01); *G03F 7/0005* (2013.01)

(58) Field of Classification Search
None
See application file for complete search history.

(56) References Cited

U.S. PATENT DOCUMENTS 1,898,723 A    2/1933  Fuller
3,570,735 A    3/1971  Kurz
(Continued)

FOREIGN PATENT DOCUMENTS

CN    2447719 Y    9/2001
DE    197 54 776    6/1999
(Continued)

OTHER PUBLICATIONS

Stephen Pople, Complete Physics, "Total internal reflection," Oxford University Press, NY, 1999, pp. 145, 173.*
(Continued)

*Primary Examiner* — Charles Capozzi
(74) *Attorney, Agent, or Firm* — Yufeng Dong

(57) ABSTRACT

Methods and systems for forming a displacement scale comprising TIR prisms on a substrate are described. A system for forming the displacement scale includes one or more rollers having a pattern of total internal reflection (TIR) prism features in negative relief. As the rollers are rotated, the scale is formed on the substrate. The rollers may also include pattern features in negative relief. Rotation of the rollers simultaneously forms the displacement scale and the pattern features on the substrate. The TIR prism features of the displacement scale may be oriented to provide measurement of one or more of lateral displacement, longitudinal displacement and angular displacement.

28 Claims, 10 Drawing Sheets

(51) Int. Cl.
  *G01D 5/347* (2006.01)
  *G03F 7/00* (2006.01)

(56) References Cited

U.S. PATENT DOCUMENTS

| | | | |
|---|---|---|---|
| 3,615,048 A | 10/1971 | Martin | |
| 3,667,031 A | 5/1972 | Cox, Jr. et al. | |
| 4,010,463 A | 3/1977 | Kay | |
| 4,049,213 A | 9/1977 | Hank et al. | |
| 4,202,600 A * | 5/1980 | Burke et al. | 359/514 |
| 4,274,748 A | 6/1981 | Burtin | |
| 4,284,221 A | 8/1981 | Nagel | |
| 4,401,893 A | 8/1983 | Dehuysser | |
| 4,529,922 A | 7/1985 | Ono | |
| 4,532,430 A | 7/1985 | Ross | |
| 4,610,739 A | 9/1986 | Jensen | |
| 4,618,518 A | 10/1986 | Pricone | |
| 4,697,485 A | 10/1987 | Raney | |
| 4,893,135 A | 1/1990 | Jamzadeh | |
| 4,945,252 A | 7/1990 | Lerner et al. | |
| 5,047,651 A | 9/1991 | Wessner | |
| 5,233,407 A * | 8/1993 | Ogata | G01D 5/347 250/237 G |
| 5,355,154 A | 10/1994 | Guerin | |
| 5,450,116 A | 9/1995 | Weiselfish | |
| 5,667,123 A | 9/1997 | Fukuda | |
| 5,759,455 A * | 6/1998 | Kamitakahara et al. | 264/1.34 |
| 5,768,776 A | 6/1998 | Pendse | |
| 5,778,724 A | 7/1998 | Clapp | |
| 5,859,707 A | 1/1999 | Nakagawa | |
| 5,870,204 A | 2/1999 | Chiu | |
| 5,931,097 A | 8/1999 | Neifert | |
| 6,056,180 A | 5/2000 | Crowley | |
| 6,087,655 A | 7/2000 | Kobrin | |
| 6,164,201 A | 12/2000 | Burke | |
| 6,273,313 B1 | 8/2001 | Noll et al. | |
| 6,322,236 B1 * | 11/2001 | Campbell et al. | 362/333 |
| 6,325,880 B1 * | 12/2001 | Yamashita | B29D 11/00278 156/209 |
| 6,375,870 B1 | 4/2002 | Visovsky | |
| 6,396,073 B1 | 5/2002 | Taylor | |
| 6,495,214 B1 | 12/2002 | Nentwich | |
| 6,505,906 B1 | 1/2003 | Bland et al. | |
| 6,521,905 B1 | 2/2003 | Luxem | |
| 6,647,128 B1 | 11/2003 | Rhoads | |
| 7,121,496 B2 | 10/2006 | Jackson | |
| 7,174,237 B2 | 2/2007 | Takayama | |
| 7,296,717 B2 | 11/2007 | Swanson et al. | |
| 7,526,230 B2 | 4/2009 | Kudo | |
| 7,560,718 B2 | 7/2009 | Wittmann | |
| 7,826,041 B2 | 11/2010 | Takeda | |
| 2002/0018220 A1 | 2/2002 | Aoki | |
| 2002/0121131 A1 | 9/2002 | Mancevski | |
| 2002/0122186 A1 | 9/2002 | Igaki | |
| 2002/0196542 A1 * | 12/2002 | Nilsen et al. | 359/530 |
| 2003/0218125 A1 | 11/2003 | Igaki | |
| 2004/0022557 A1 | 2/2004 | Kudo | |
| 2004/0197443 A1 | 10/2004 | Scarabelli et al. | |
| 2004/0227644 A1 | 11/2004 | Lin | |
| 2004/0240513 A1 | 12/2004 | del Puerto | |
| 2004/0262505 A1 | 12/2004 | Atsuta | |
| 2005/0127542 A1 * | 6/2005 | Kaminsky et al. | 264/1.34 |
| 2005/0141243 A1 * | 6/2005 | Mullen et al. | 362/600 |
| 2005/0218237 A1 | 10/2005 | Lapstun | |
| 2005/0231809 A1 * | 10/2005 | Carlson et al. | 359/619 |
| 2005/0232475 A1 | 10/2005 | Floeder et al. | |
| 2005/0263689 A1 | 12/2005 | Atsuta | |
| 2005/0274880 A1 | 12/2005 | Atsuta | |
| 2006/0174992 A1 | 8/2006 | Brost | |
| 2006/0210714 A1 | 9/2006 | Huizinga et al. | |
| 2007/0099396 A1 | 5/2007 | Hirai | |
| 2007/0138153 A1 | 6/2007 | Redman | |
| 2008/0039718 A1 | 2/2008 | Drinan | |
| 2008/0073493 A1 | 3/2008 | Atsuta | |

FOREIGN PATENT DOCUMENTS

| | | |
|---|---|---|
| EP | 0 838 665 | 4/1998 |
| EP | 1 235 054 A2 | 8/2002 |
| EP | 1 722 201 A2 | 11/2006 |
| GB | 2 065 871 | 7/1981 |
| GB | 2 195 179 | 3/1988 |
| JP | 62-005127 | 1/1987 |
| JP | 62-111860 | 5/1987 |
| JP | 02-037963 | 8/1990 |
| JP | 05-010725 | 1/1993 |
| JP | 08-229955 | 9/1996 |
| JP | 11-167165 A | 6/1999 |
| JP | 2005-178962 | 7/2005 |
| WO | WO 2005/106104 | 11/2005 |
| WO | WO 2006/107057 | 10/2006 |
| WO | WO 2007/027757 | 3/2007 |
| WO | WO 2007/044798 | 4/2007 |

OTHER PUBLICATIONS

Chiang et al, "Optical alignment and tilt-angle measurement technique based on Lloyd's mirror arrangement," Opt. Lett. 17(14),1992, pp. 1024-1025.*
U.S. Appl. No. 60/884,494, filed Jan. 11, 2007, entitled "Web Longitudinal Position Sensor".
U.S. Appl. No. 60/944,882, filed Jun. 19, 2007, entitled "Systems and Methods for Indicating the Position of a Web".
U.S. Appl. No. 60/944,888, filed Jun. 19, 2007 entitled "Total Internal Reflection Displacement Scale".
U.S. Appl. No. 61/141,128, filed Dec. 29, 2008, entitled "Phase-locked Web Position Signal Using Web Fiducials".
U.S. Appl. No. 61/141,308, filed Dec. 30, 2008, entitled "Apparatus and Method for Making Fiducials on a Substrate".

* cited by examiner

SYSTEMS AND METHODS FOR FABRICATING DISPLACEMENT SCALES

PRIORITY

This application claims priority to U.S. Provisional Application No. 60/944,890 filed on Jun. 19, 2007, the disclosure of which is incorporated herein by reference.

TECHNICAL FIELD

The present disclosure is related to a scale for determining displacement, the scale employing a plurality of total internal reflection (TIR) optical prisms as scale features for measuring displacement.

BACKGROUND

Optical encoders are used to measure the displacement of a substrate or other article of interest. Typically an optical encoder includes a light source, a scale which is attached to the substrate or other article of interest, and a photosensing element. The scale modulates light directed from the light source by reflecting, transmitting, and/or blocking some of the light. The photosensing element is positioned to sense the modulated light and generates an output signal corresponding to the modulated light. Displacement of the article of interest is determined by analyzing the output signal of the photosensor.

SUMMARY

Embodiments of the present disclosure involve methods and systems for forming a displacement scale comprising TIR prisms on a substrate. In accordance with one embodiment, a system for forming the displacement scale includes one or more rollers having total internal reflection (TIR) prism features in negative relief. A drive mechanism is configured to rotate the rollers so that the scale comprising TIR features is formed on the substrate surface. The rollers may also include pattern features in negative relief. In this configuration, rotation of the rollers simultaneously forms the displacement scale and the pattern features on the substrate.

In some embodiments, a dispenser dispenses material on the substrate surface and rotation of the rollers forms the displacement scale comprising the TIR prism features in the material on the substrate surface. For example, the material may comprise a curable material, a UV curable resin, a castable polymer, a thermally curable material, or other curable or castable material. In these embodiments, the system may include a curing station, such as a heat source or UV light source configured to cure the TIR prism features of the scale.

In some embodiments, the system may comprise one or more additional rollers including web pattern features in negative relief. An additional drive mechanism rotates the one or more additional rollers so that pattern features are formed the substrate. The web pattern features may be formed simultaneously with the formation of the scale.

In one configuration, in addition to the displacement scale features, the rollers also have a first set of pattern features in negative relief. The rotation of the rollers simultaneously forms the TIR scale and the first set of pattern features on the substrate. The scale is configured to facilitate transfer of the additional pattern features to the substrate in registration with the first set of pattern features.

According to various aspects, the substrate may comprise a flexible web, such as a polymeric web or the substrate may comprise a rigid material, such as glass, The TIR features may be oriented to provide measurement of lateral displacement, to measure longitudinal displacement, or both. The TIR features may be configured to measure angular rotation or to measure various web parameters.

Another embodiment involves a method of forming a scale comprising TIR prism features on a substrate. The substrate is brought into contact or close proximity with the one or more rollers having total internal reflection (TIR) prism features in negative relief. The rollers are rotated relative to the substrate so that the displacement scale comprising TIR prism features is formed on a surface of the substrate.

In some configurations, the material used to form the TIR prisms is dispensed onto the substrate. The rollers are rotated so that the TIR prisms are formed in the material on the substrate.

A first layer of pattern features maybe formed concurrently with the formation of the scale. The scale may subsequently be used in the next processing step to align additional pattern features with the first set of pattern features.

Another embodiment of the disclosure is directed to a tool configured to form a displacement scale on a substrate. The tool includes a roller having total internal reflection (TIR) prism features arranged to form a displacement scale and pattern features in negative relief. The roller is configured to simultaneously form the displacement scale and pattern features on a substrate when the roller is rotated in contact or close proximity with the substrate.

The above summary of the present disclosure is not intended to describe each embodiment or every implementation of the present disclosure. Advantages and attainments, together with a more complete understanding of the disclosure, will become apparent and appreciated by referring to the following detailed description and claims taken in conjunction with the accompanying drawings.

Figure 1A:
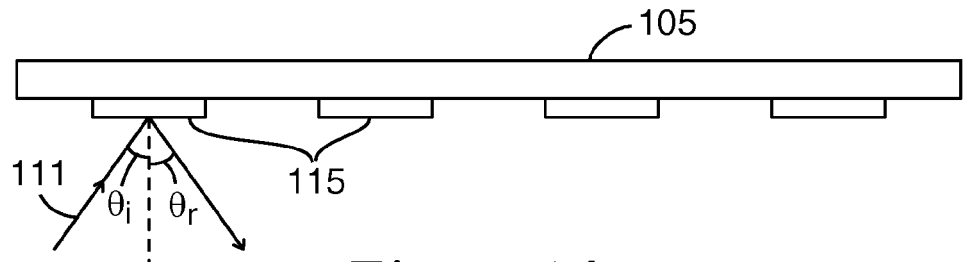
FIG. 1A illustrates the use of total internal reflection for indicating web position in accordance with embodiments of the disclosure.

While the disclosure is amenable to various modifications and alternative forms, specifics thereof have been shown by way of example in the drawings and will be described in detail. It is to be understood, however, that the intention is not to limit the disclosure to the particular embodiments described. On the contrary, the intention is to cover all modifications, equivalents, and alternatives falling within the scope of the disclosure as defined by the appended claims.

DETAILED DESCRIPTION

There is a need for enhanced methods and systems for indicating displacement of a substrate. The present disclosure fulfills these and other needs, and offers other advantages over the prior art.

In the following description of the illustrated embodiments, reference is made to the accompanying drawings which form a part hereof, and in which is shown by way of illustration, various embodiments in which the disclosure may be practiced. It is to be understood that the embodiments may be utilized and structural changes may be made without departing from the scope of the present disclosure.

Embodiments of the present disclosure illustrate a scale for determining displacement of a substrate or other article of interest, and methods and systems for making and using the scale. The scale may be used to provide an indication of web translational and/or rotational displacement and may be employed to determine web position and/or to control movement of the flexible web. Additionally or alternatively to indicating translational displacement and/or rotational displacement of the web, the scale may also be used to measure various parameters of the web or ambient environment surrounding the web. For example, as discussed in more detail below, the scale may be used to measure temperature and/or modulus of elasticity of the web, and/or may be used to measure web strain. The substrate may be made of a transparent, rigid material, such as glass, or may comprise a transparent, flexible, stretchable material, such as a flexible, polymeric web.

The scale includes a plurality of optical scale features configured as total internal reflection (TIR) prisms. Total internal reflection occurs when the incident angle of light, $\theta_i$, on a prism face is greater than or equal to a critical angle $\theta_c$. For incident angles greater than $\theta_c$, all incoming light is reflected.

FIG. 1A shows a scale comprising TIR features 115 on a substrate 105 and illustrates the principle of total internal reflection as it is used in accordance with various embodiments. Light generated by a light source (not shown) is directed toward the substrate 105 having an integral scale comprising TIR scale features 115. If the angle, $\theta_i$, of the light 111 directed toward the TIR scale features 115 is greater than or equal to the critical angle $\theta_c$, then the light is reflected at angle $\theta_r$ as indicated in FIG. 1A.

Figure 1B:
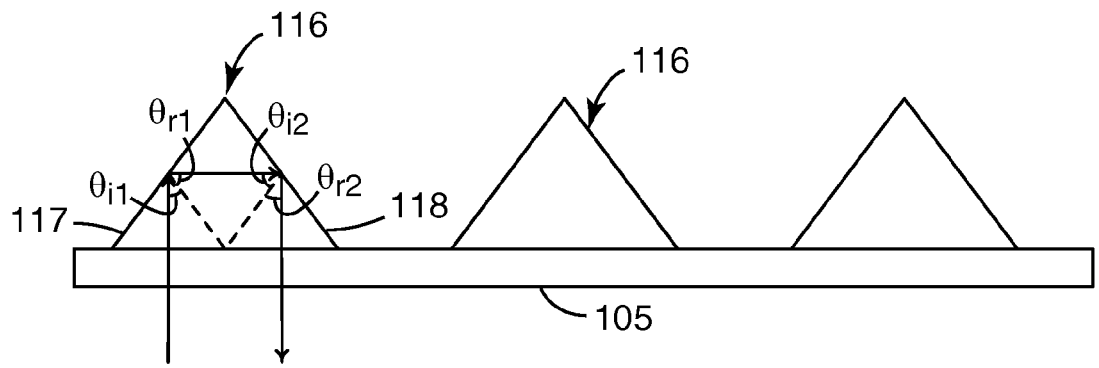
FIG. 1B illustrates scale elements comprising right regular prisms configured to provide total internal reflection for indicating web position in accordance with embodiments of the disclosure.

The TIR scale features may be formed in any shape or configuration that provides reflection via TIR. In some embodiments, the TIR scale features may comprise right regular prisms, as illustrated in FIG. 1B. In this embodiment, if the angle, $\theta_{i1}$, of the light incident light incident on the left face 117 of the TIR scale feature 116 is greater than $\theta_c$, the light is totally internally reflected to the right prism face 118 with incident angle $\theta_{i2}$. At the right prism face 118, the light is again totally internally reflected at angle $\theta_{r2}$ and exits the prism 116 substantially parallel to the incident light. Reflection via TIR conveniently reflects nearly all the light incident on the face of the TIR scale features without deterioration that may occur with metallized surfaces that are typically used for reflective scales.

Figure 2A:
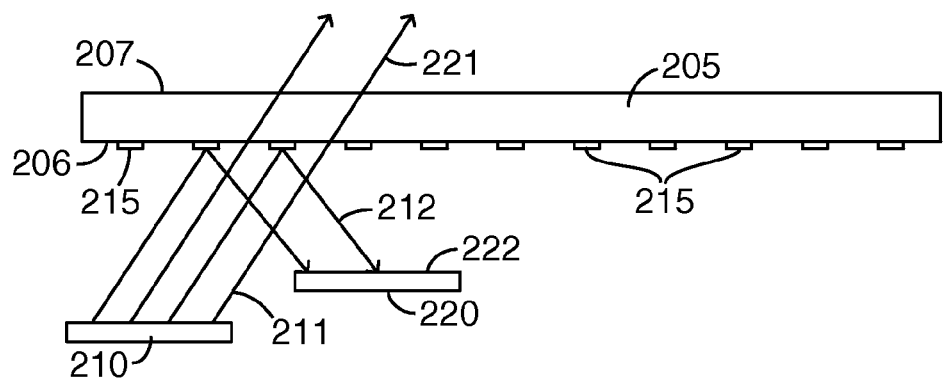
FIG. 2A illustrates a system for indicating web position operating in reflective mode in accordance with embodiments of the disclosure.
Figure 2B:
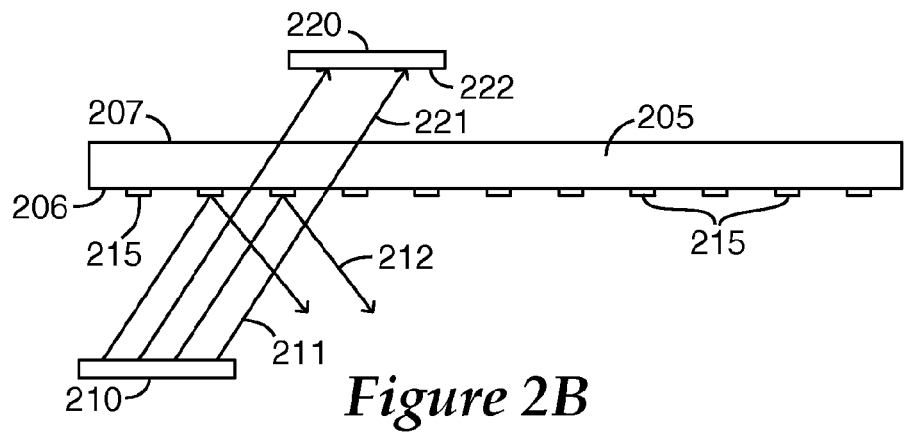
FIG. 2B illustrates a system for indicating web position operating in transmissive mode in accordance with embodiments of the disclosure.

FIGS. 2A-2D are diagrams of systems configured to indicate displacement of a substrate using a TIR scale disposed on the substrate. As illustrated in FIGS. 2A and 2B, the systems include a light source 210 that directs light 211 toward the substrate 205 which can move relative to the fixed positions of the light source 210 and a photosensor 220.

The system of FIG. 2A illustrates system for indicating substrate displacement operating in reflective mode. In reflective mode, the light source 210, which may be a multi-source array, and one or more photosensors 220 are positioned near the same surface 206 of the substrate 205. The light source 210 directs light 211 toward a surface 206 of the substrate 205. A portion of the light 212 is reflected by the TIR scale features 215 toward the photosensor 220. The photosensor 220 senses the reflected light and generates an analog output signal that may be used to indicate substrate displacement. In this embodiment, the substrate 205 may or may not be transparent. In configurations where the substrate 205 is transparent, a portion of the light 221 may be transmitted through the substrate 205. It will be appreciated that if the substrate 205 is transparent, the TIR scale features 215 may be positioned on either surface 206, 207 of the substrate 205, or on both surfaces 206, 207.

FIG. 2B illustrates a system for indicating web position that operates in transmissive mode. In this configuration, the light source 210 and photosensors 220 are positioned on opposite surfaces 206, 207 of the web 205. The light source 210 directs light 211 toward a surface 206 of the web 205. A portion of the light 212 is reflected by the scale elements 215. Another portion of the light 221 passes through the transparent web 205 to the photosensor 220. The photosensor 220 senses the transmitted light 221 and generates an analog output signal.

Figure 3A:
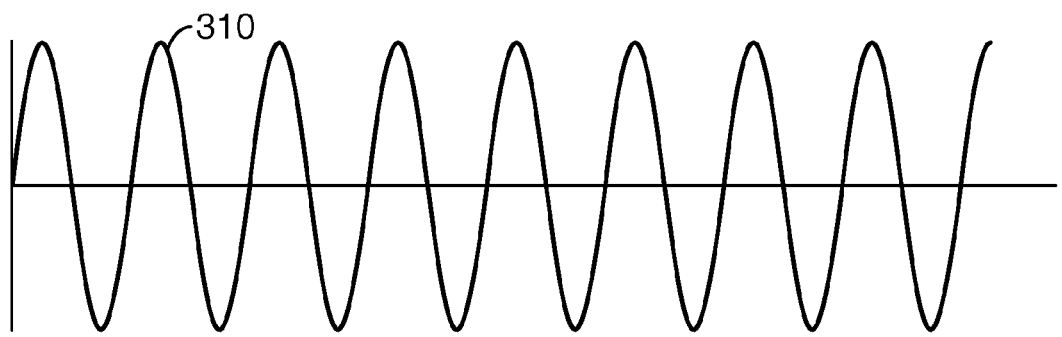
FIG. 3A is graph of light intensity at the surface of a photodetector, the light intensity modulated by scale features in accordance with embodiments of the disclosure.

In FIGS. 2A and 2B, as the substrate 205 moves in relation to the fixed positions of the light source 210 and the photosensor 220, the light intensity at the active surface 222 of the photosensor 220 is modulated by the TIR scale features. The light intensity at the active surface 222 of the photosensor 220 for the systems of FIGS. 2A and 2B is illustrated by the light intensity graph 310 of FIG. 3A. The relative motion of the substrate 205 causes the light intensity at the surface 222 of the photosensor 220 to be modulated sinusoidally. The photosensor 220 detects the light and generates a corresponding sinusoidal analog output signal that tracks the light intensity at the active surface 222 of the photosensor 220. The analog output signal generated by the photosensor 220 may be used to determine displacement of the substrate 205.

Figure 2C:
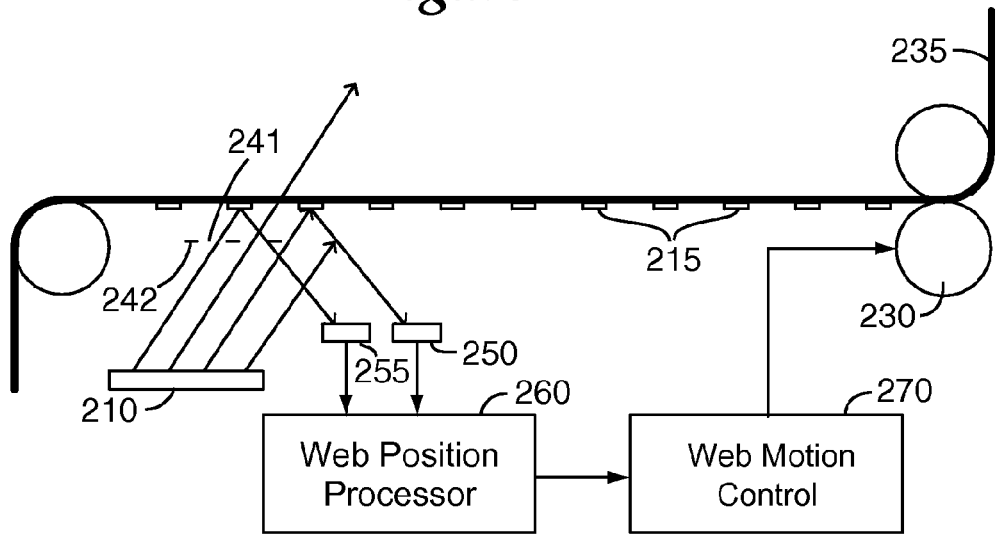
FIG. 2C illustrates a system for controlling web movement operating in reflective mode in accordance with embodiments of the disclosure.
Figure 2D:
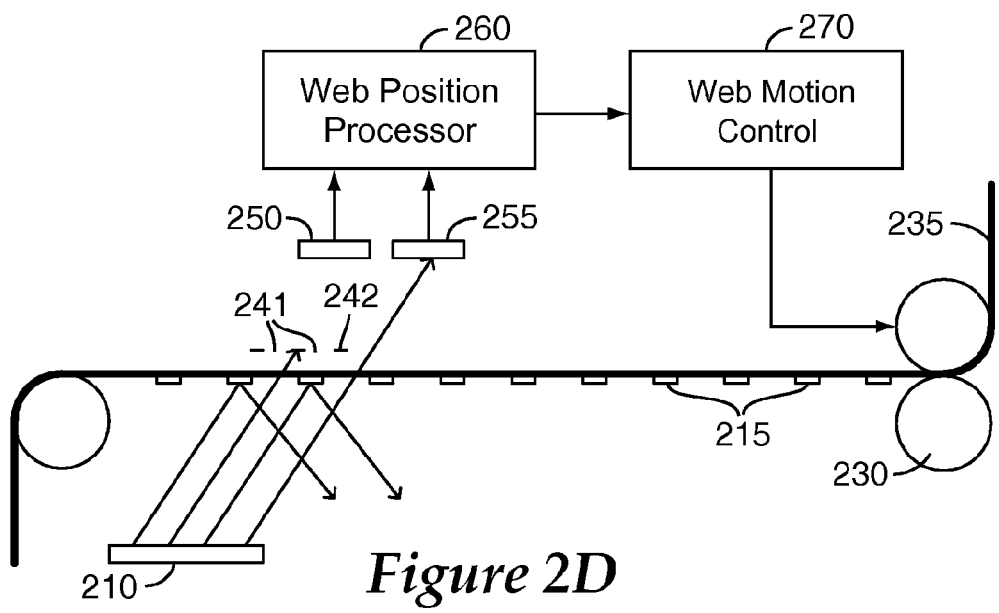
FIG. 2D illustrates a system for controlling web movement operating in transmissive mode in accordance with embodiments of the disclosure.

In some embodiments the analog output signal generated by the photosensor may be used to control movement of the substrate. For example, the use of TIR scale features disposed on a flexible, elongated web substrate is particularly useful for roll-to-roll manufacturing applications. FIGS. 2C and 2D illustrate systems for controlling web movement when the components used to indicate web position are arranged to operate in reflective (FIG. 2C) and transmissive (FIG. 2D) modes. The elongated web 235 may be unwound from a roll or may come from prior manufacturing process. The components used to indicate web position in FIGS. 2C and 2D are similar to those illustrated in FIGS. 2A and 2B, respectively, except the systems of FIGS. 2C-2D each additionally include a scanning reticle 240 and have dual photosensors 250, 255. The web 235 is in motion relative to the fixed positions of the light source 210, scanning reticle 240, and photosensors 250, 255.

The scanning reticle 240 is positioned a short distance from the web 235 so that the reticle windows 241 allow a portion of the light directed toward the web 235 to pass through the reticle 240. Regions 242 of the reticle 240 between the windows 241 block a portion of the light.

Figure 3B:
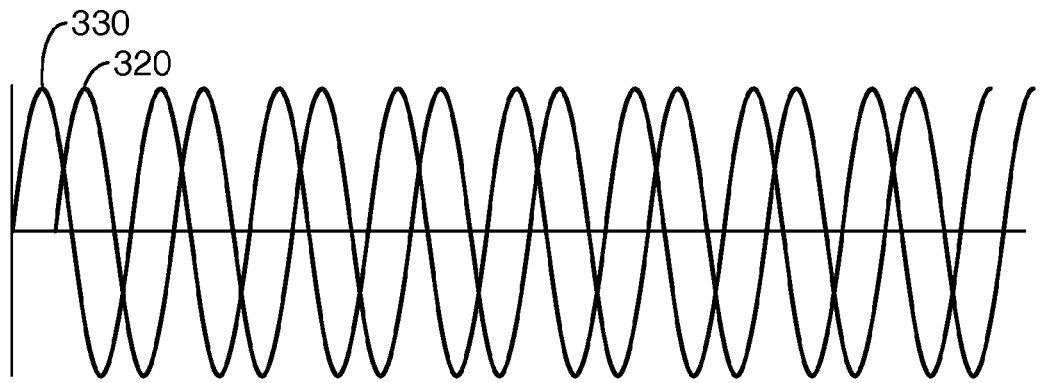
FIG. 3B illustrates graphs of light intensity at the surface of dual photosensors, the light intensity modulated by scale features and a scanning reticle to achieve sinusoidal light intensities with a phase difference of about 90° in accordance with embodiments of the disclosure.

The photosensors 250, 255 sense light present at the surface of the sensors 250, 255 and generate independent output signals. As previously described, when the web 235 is in motion relative to the light source 210 and a photosensor 250, the TIR scale features 215 cause the light intensity present at the photosensor 250 to be sinusoidally modulated. The scanning reticle may be used to further modulate the light present at the photosensors 250, 255. Through the use of the scanning reticle 240, the light intensity at the photosensors 250, 255 corresponds to the two symmetrical sinusoidal signals 320, 330 phase shifted by 90° as illustrated in FIG. 3B. Output signals tracking the modulated light intensity present at the surface of the photosensors 250, 255 are produced by the photosensors 250, 255 to indicate web position.

The output signals generated by the photosensors 250, 255 are analyzed by the web position processor 260 to determine the position of the web. For example, the web position processor 260 may determine the position and direction of motion of the web 235 relative to the photosensors 250, 255. With appropriately placed TIR scale features and associated position indicating components of the system, the web position in one or both of the cross web and down web directions may be determined. This information is used by the web motion controller 270 to control a web transport system 230 that moves the web.

In some embodiments, multiple light sources and/or multiple photosensors may be used for sensing translational and/or angular displacement of the web and/or for determining web parameters. Systems using multiple sensor combinations provide signal redundancy, providing a more robust system. In some embodiments, energy is modulated by more than one scale feature, for example about 3 to 20 features. The output signal from a sensor may average or otherwise combine the energy modulated by the multiple features. If a single feature, or even several features, are damaged or obscured by dirt, the averaged output signal is minimally impacted.

Figure 2E:
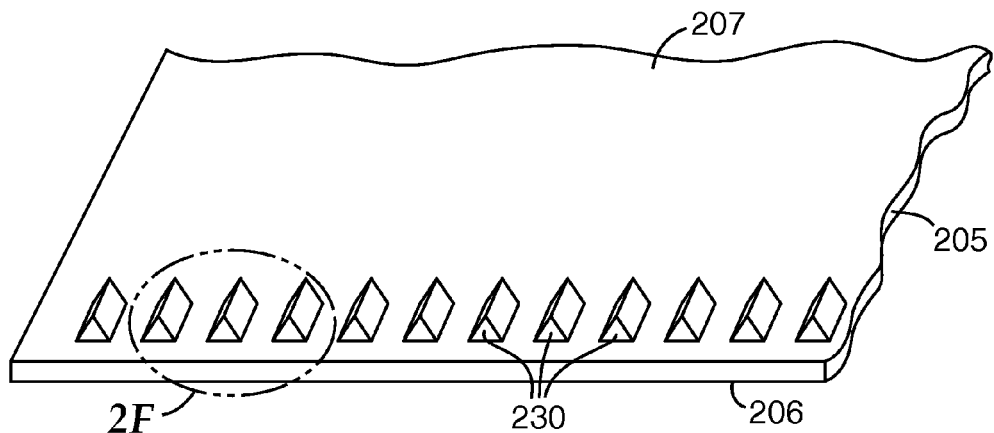
FIGS. 2E and 2F illustrate scale features arranged longitudinally on a web in accordance with embodiments of the disclosure.
Figure 2F:
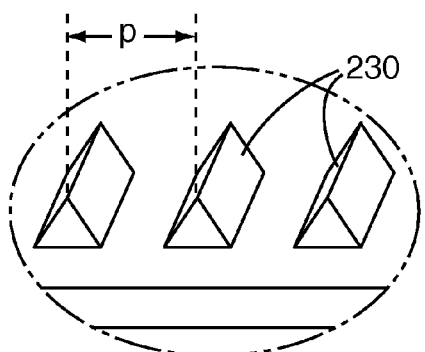
Figure 2H:
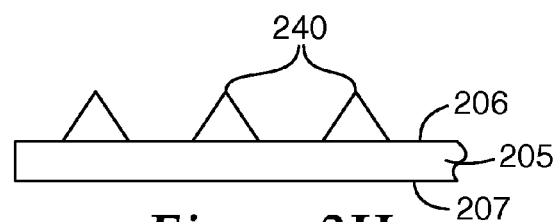
FIGS. 2G and 2H illustrate scale features arranged laterally on a web in accordance with embodiments of the disclosure.
Figure 2G:
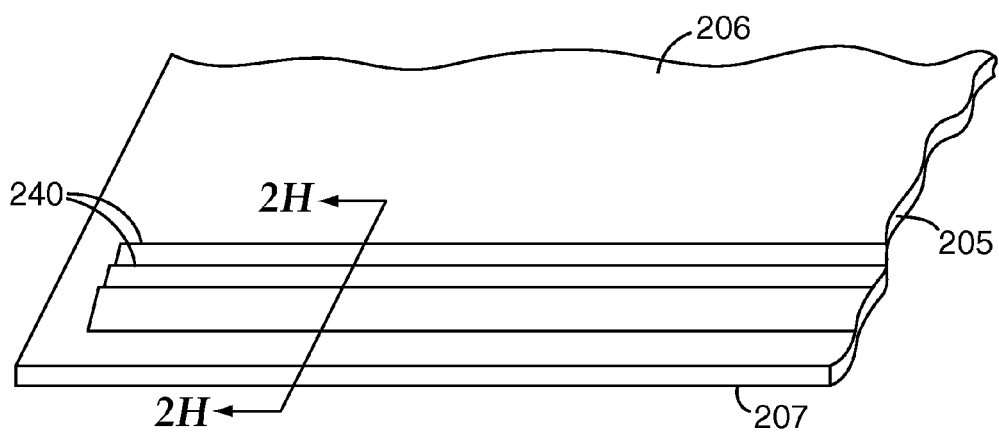

The scale features may include longitudinally arranged features, laterally arranged features or a combination of both longitudinally and laterally arranged features. As illustrated in FIGS. 2E and 2F, in one embodiment, a set of scale features 230 may be arranged for longitudinal displacement measurement on top 207, bottom 206 or on both surfaces 206, 207 of the web 205. A set of light source and sensor components, as illustrated in FIGS. 2A-2D, are configured to detect the energy modulated by the longitudinal scale features 230 and to generate signals that indicate longitudinal displacement of the web 205 and/or may be used to measure other web parameters. In one embodiment, shown in FIGS. 2G and 2H, a set of scale features 240 may be arranged for lateral displacement measurement on the top 207, bottom 206 or on both surfaces 206, 207 of the web 205. A set of light source and sensor components are configured to detect the energy modulated by the lateral scale features and to generate signals that indicate lateral displacement of the web and/or may be used to measure other web parameters.

The scale features illustrated in FIGS. 2E-2H are linear triangular prisms, which may have a prism pitch and distance between prisms ranging down to about a few microns. Convenient dimensions for this type of prism include a prism pitch of about 40 μm and a distance between prisms of about 20 μm.

Figure 2I:
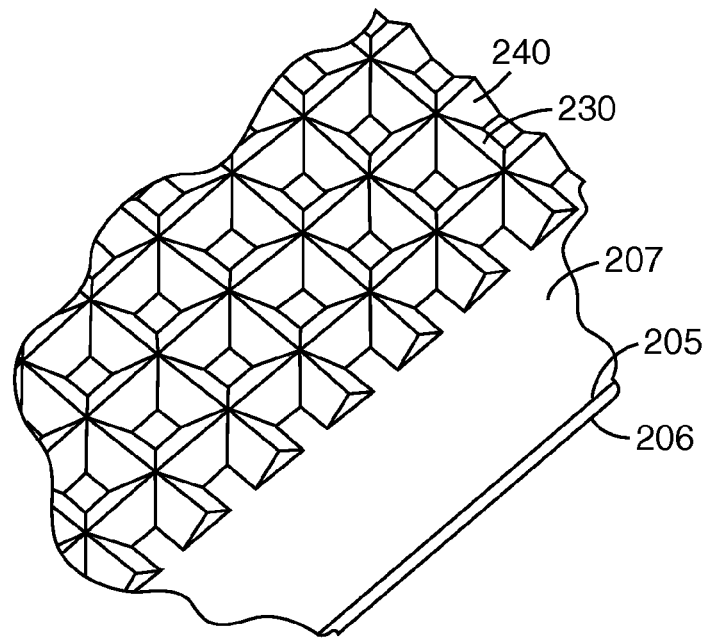
FIG. 2I illustrates longitudinal and lateral scale features in a checkerboard pattern in accordance with embodiments of the disclosure.

The use of both longitudinal and lateral scale features and compatible source/sensor combinations allows for indication of longitudinal and lateral web displacement as well as angular displacement. FIG. 2I illustrates a web with both longitudinal 230 and lateral 240 scale features disposed on the top surface 207 of the web 205. The longitudinal and lateral scale features 230, 240 may be disposed on opposite sides of the web 205 or on the same side of the web. If the longitudinal and lateral features 230, 240 are disposed on the same side of the web 205, they may form the checkerboard pattern as illustrated in FIG. 2I. The longitudinal and lateral features may be connected as illustrated in FIG. 2I, or may comprise an alternating pattern of discrete, disconnected prisms. In some embodiments, the checkerboard pattern may include regions of multiple longitudinal features alternating with regions of multiple lateral features.

Determination of continuous web position using an integral TIR scale disposed on the web may be employed to control movement of the web during deposition of pattern features in one or a number of successive manufacturing steps. For example, the TIR scale described in connection with the embodiments of the disclosure provided herein may be used to indicate continuous web position. The indication of web position facilitates alignment between multiple layers of pattern features deposited or otherwise formed on a web during a roll-to-roll manufacturing process. The scale described herein is particularly useful for manufacture of flexible, multi-layer electronic or optical devices that require multiple deposition steps to form successive layers of pattern features on a flexible web. The TIR scale features may be formed, for example, on a flexible, polymeric web having a bend radius of less than about 100 mm, less than about 50 mm, less than about 25 mm, or even less then about 5 mm, for example. The small bend radius allows fabrication of the TIR scale as a roll good.

Additionally, the approaches described herein may be used to automatically compensate for changes in web strain that commonly occur in web processing applications. For example, in some embodiments, the scale features are deposited on the web substantially concurrently with a layer of web pattern features, such as the first layer of web pattern features used to form multi-layer electronic or optoelectronic devices. As the scale features and the web pattern features are deposited, the pattern features and the scale features experience the same amount of web strain. In this configuration, the scale features may be used to accurately track the position of the first layer web pattern features, regardless of the amount of web strain in subsequent processes. The scale features may be used to accurately track the lateral position, longitudinal position, and/or angular rotation of the first layer web pattern features, regardless of the amount of web strain in subsequent processes.

As web strain is increased (i.e. the web is stretched more) the scale features are stretched along with the corresponding web pattern features formed on the web. This phenomenon allows the scale features to be used to more accurately track the position of features deposited on the web. Using the scale described in accordance with various embodiments herein, accurate alignment with the concurrently or subsequently deposited web pattern features can be achieved even when the web is stretched. Additional details regarding the use of scale features to indicate the position of a flexible web, aspects of which may be used in connection with embodiments of the present disclosure, are provided in commonly owned U.S. Patent Application identified by Ser. No. 60/980,205, filed concurrently with the present application, and incorporated herein by reference.

Additionally or alternatively to providing for the indication of translational displacement and/or angular rotation of the web, the scale may also be used to measure various parameters of the web or ambient environment surrounding the web. For example, as discussed in more detail below, the scale may be used to measure temperature, modulus of elasticity of the web, and/or web strain.

Figure 4A:
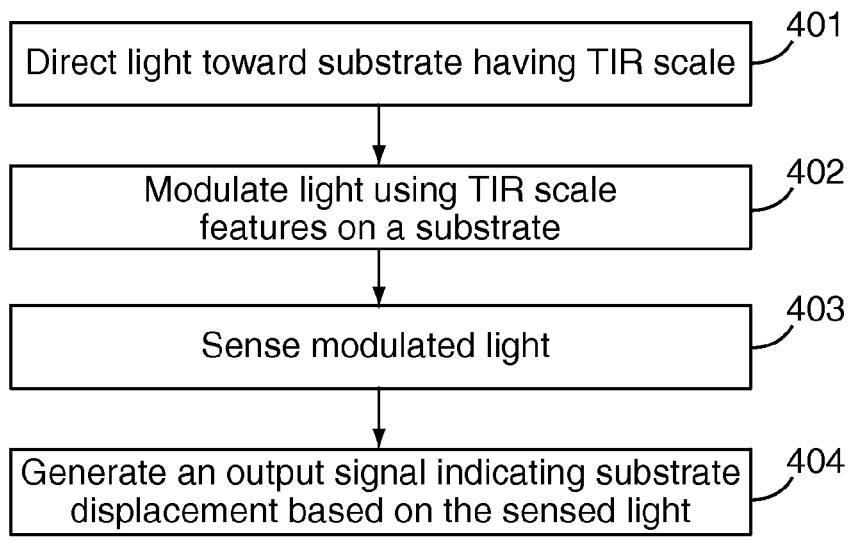
FIG. 4A is a flow diagram illustrating a process for indicating substrate position using a TIR scale in accordance with embodiments of the disclosure.

FIG. 4A is a flow diagram illustrating a process for indicating substrate position using a TIR scale in accordance with embodiments of the disclosure. Light is directed 401 toward a substrate having a TIR scale disposed thereon. For example, in one implementation, the scale features may comprise a series of discrete prisms arranged longitudinally on the web. The longitudinally arranged prisms are configured for light modulation that can be measured to determine the longitudinal displacement. In another implementation, the scale features may comprise a first set of prisms arranged longitudinally and another set of prisms arranged laterally. The longitudinal and lateral prisms are configured to modulate light for determination of longitudinal and lateral displacement of the web and may also be used to determine the angular rotation of the web.

The TIR features of the scale modulate 402 the light directed toward the substrate. The modulated light is sensed 403 by a photosensor and an output signal that indicates substrate displacement is generated 404 based on the sensed light. By this approach, one more degrees of freedom of the web can be measured. The output signal may provide continuous indication of the longitudinal displacement, the lateral displacement, and/or the angular rotation of the web.

Figure 4B:
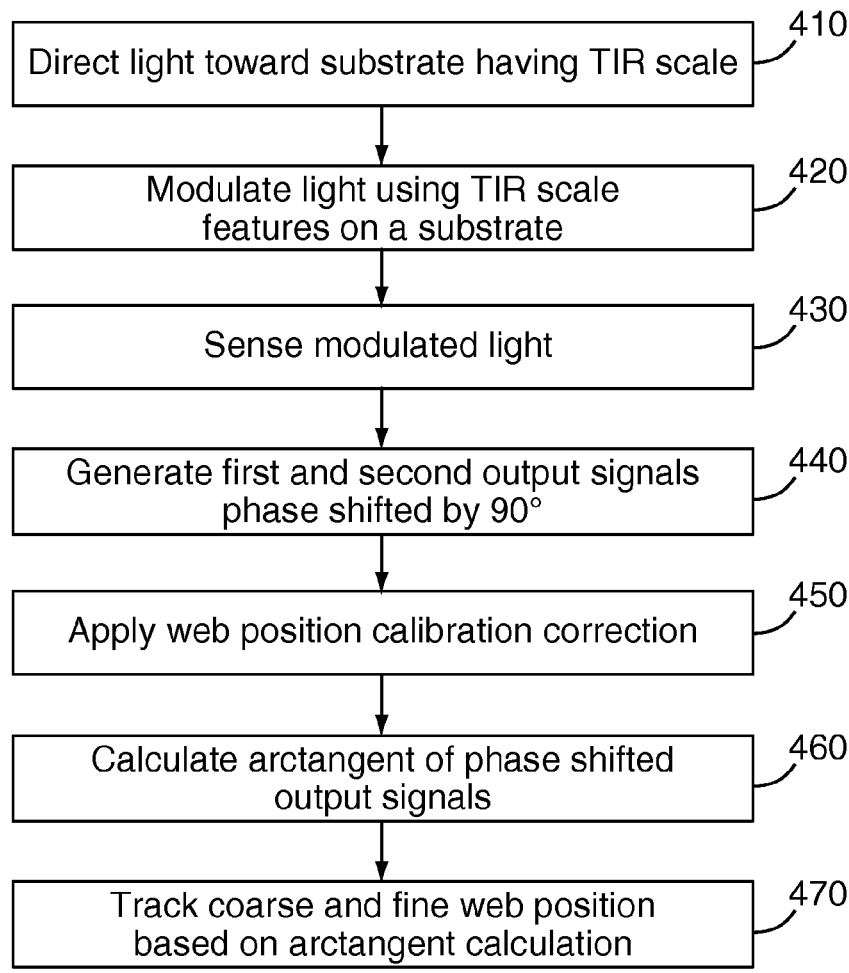
FIG. 4B is a flow diagram illustrating a method for determining coarse and fine web position in accordance with embodiments of the disclosure

As previously discussed in connection with FIG. 3B, the signals used to track web position may comprise sine and cosine signals. The sine and cosine signals advantageously allow determination of a coarse and fine web position. FIG. 4B is a flow diagram illustrating a method for determining coarse and fine web position in accordance with embodiments of the disclosure. Light is directed 410 toward a substrate having TIR features disposed thereon. The TIR features modulate 420 the light directed toward the substrate. The modulated light is sensed 430 by a photosensor and first and second output signals phase shifted by 90° are generated 440. A web position correction is applied 450. The arctangent of the phase shifted output signals is calculated 460 and is used to track 470 the coarse and fine position of the web.

As previously discussed, the use of a flexible, elongated web having an integral scale is particularly advantageous for use in roll-to-roll manufacturing processes. For example, the integral scale may be used in positioning the web for manufacturing processes that require alignment during successive manufacturing steps, such as in the formation of layered electronic or optical devices. Web positioning using the integral scale as illustrated herein may be used in the manufacture of flexible circuits for low cost electronics, memories, signage, electronic paper, displays incorporating liquid crystals (LCDs) or organic light emitting diodes (OLEDs), or other applications.

Figure 5A:
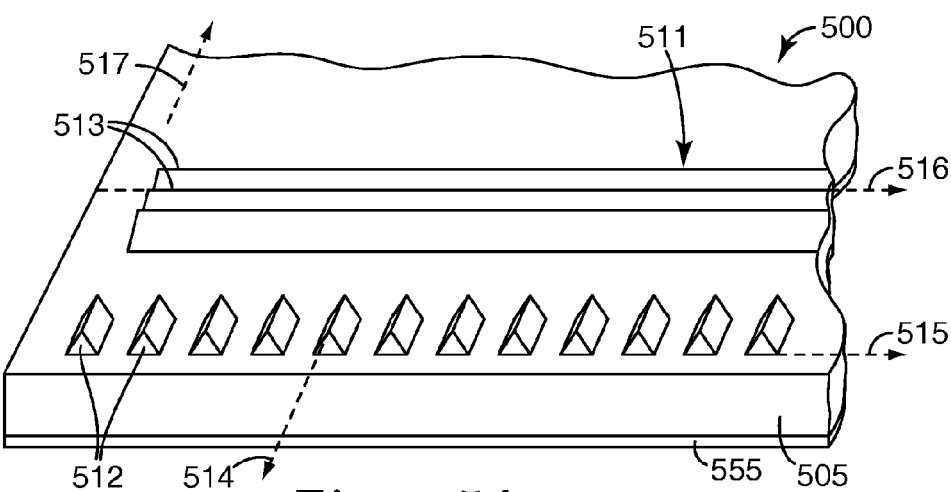
FIG. 5A is a diagram of a roll good comprising a web having integral scale features in accordance with embodiments of the disclosure.

FIG. 5A illustrates a portion of a web 505 having an integral TIR scale 511 which may be sold as a roll good 500. The TIR scale 511 may include one or both TIR features 512 arranged to be used for longitudinal (down-web) positioning and TIR features 513 arranged to be used for lateral (cross-web) positioning. The TIR prisms 512 used for longitudinal positioning are arranged so that the axes of the prisms 514 is at an angle, e.g., substantially perpendicular, to the longitudinal direction of the web 515. The TIR prisms 513 used for lateral positioning are arranged so that the axes of the prisms 516 is at an angle, e.g., substantially perpendicular, to the lateral direction of the web 517. The web/scale roll good product 500 may be used in manufacturing processes with the scale 511 used to provide position information to facilitate formation of pattern features on the web 505.

Figure 5B:
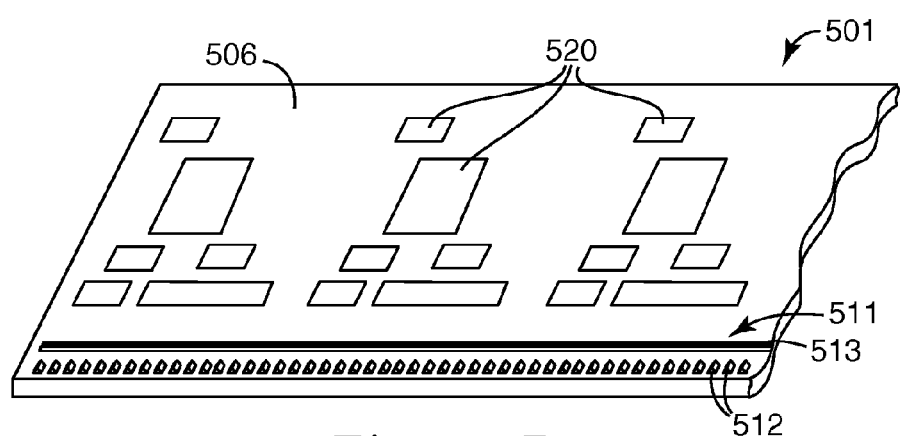
FIG. 5B is a diagram of a portion of a roll good comprising a web having an integral scale and also having pattern features deposited on the web in accordance with embodiments of the disclosure.

Alternatively, as illustrated in FIG. 5B, a roll good 501 may comprise the flexible web 506 having an integral TIR scale 511 along with a first layer of web pattern features 520. The TIR scale 511 may be formed on the web 506 concurrently with a first layer of web pattern features 520, or the TIR scale 511 and the web pattern features 520 may be formed on the web 506 in separate manufacturing steps. The configuration of a web 506 having an integral TIR scale 511 along with a first layer of web pattern features 520 is particularly helpful in compensating for transient or permanent dimensional changes in the web 506 during successive layer depositions. For example, polymer webs may be prone to tension which changes length of article shrinkage or expansion due to thermal processing, and/or to absorption or desorption of water or other solvents, making layer-to-layer alignment difficult. When the TIR scale features 512, 513 and the first layer of web pattern features 520 are concurrently formed, alignment of subsequent depositions using the integral TIR scale 511 provides automatic compensation for changes in web strain that commonly occur in web processing applications. As web strain is increased (i.e. the web is stretched more) the scale elements are stretched along with the first layer of web pattern features formed on the web. When the pattern features 520 and scale features 512, 513 experience the same dimensional changes during formation it allows the scale features 512, 513 to more accurately track the position of pattern features 520 deposited on the web 506. In some embodiments, the web 505 may include an adhesive layer 555 on one surface of the web 505.

Figure 5C:
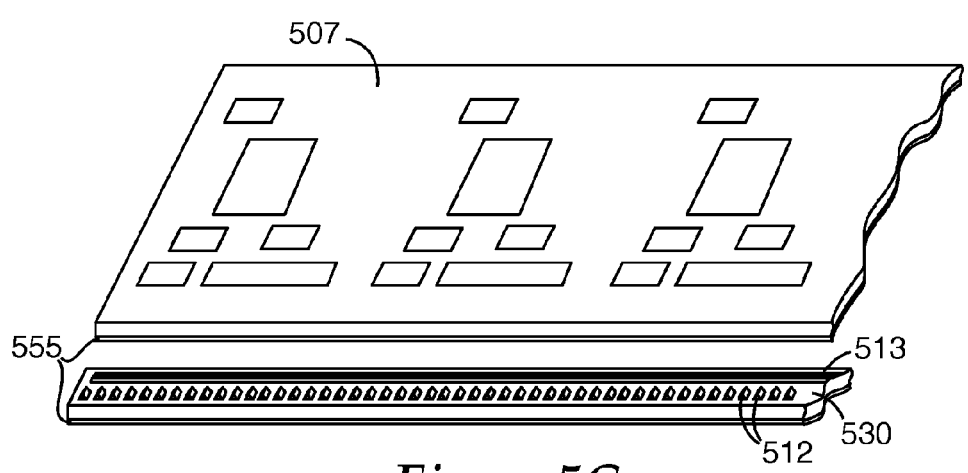
FIG. 5C is a diagram of a scale which has been separated from a web in accordance with embodiments of the disclosure.

In some embodiments, illustrated in FIG. 5C, the scale portion 530 may be separated from the portion of the web 507 having the pattern features. The scale portion 530 and the web portion 507 may be sold as separate roll goods. The scale portion 530 may be attached to a different web and used for web positioning as described herein. As previously discussed in connection with FIG. 5B, the scale portion 530 and/or the web portion 507 may include an adhesive 555. The adhesive 555 is particularly useful for attaching the scale portion 530 to a different web, for example.

Scales formed on flexible material are particularly useful when they are attached to a base substrate. One consideration encountered when attaching scales to a machine or other substrate is the difference in the coefficient of thermal expansion (CTE) between the substrate and the scale. For example, if a very rigid scale is used, the scale will expand at a different rate than the substrate, so the scale changes a different amount by $(CTE_{scale}-CTE_{substrate})*deltaT*scale$ length. If the scale expands less than the substrate, it is relatively easy to manage, as the scale is in tension, and will always follow a straight line. However, if the scale expands more than the substrate, the scale will be in compression, and additional forces are generated that tend to buckle the scale (i.e. the scale tends to ripple out of plane). The compressive force generated is $\lambda(modulus)*A(area)*strain$.

Flexible scales formed in accordance with various embodiments of the disclosure have CTE's about 5 times higher than the typically used steel scales, but have modulus of elasticity about 300 times less that steel scales. The net force is about 60 times smaller. Thus, a flexible scale described herein may be bonded to a substrate without significant buckling, allowing the scale to more closely track the position of the substrate.

By using a flexible scale, such as a plastic or polymer scale having rectangular array of pyramids which allow x/y readout, it is possible to make flexible scale much larger than scales currently available. For example, it is possible to make scales that are miles long with widths of 60 inches or more.

The embodiments described herein involve displacement scales having TIR scale features used to indicate displacement of a substrate. These scales may be used to indicate the displacement of substrates, and are useful to provide continuous tracking of the longitudinal (down-web), the lateral (cross-web) position, and or the angular displacement of the web. Additionally, or alternatively, the scale features may be employed in the measurement of various web parameters. In various embodiments, parameters which depend on dimensional changes of the web, such as temperature, strain, and/or modulus of elasticity, may be measured using the scale features.

In one application, the scale features may be used to measure a change in web temperature. A change in web temperature of $\delta T$ causes a corresponding dimensional change of $\delta L_T$. The scale features and sensor circuitry can be used to measure the dimensional change, $\delta L_T$. The change in temperature of the web, $\delta T$, may be derived from the measured dimensional change.

The scale features may be used to measure web strain, the amount of deformation caused by force that stretches the web. For example, considering only longitudinal strain, as the web having an initial length of L is stretched along its longitudinal (x) axis, the web length changes by $\delta L$, from a first length, $L_1$, to a second length, $L_2$. The linear strain, $\epsilon_x$, of the longitudinally stretched web is expressed by $\epsilon_x = \delta L/L_0$. The strain along the x axis at any point of the web may be expressed as the differential of the displacement in the x direction at any point along the axis, $\epsilon_x = \partial u_x/\partial x$. The angular or shear strain takes into account deformation along both the longitudinal (x) axis and the lateral (y) axis. The angular or shear strain at any point of a web, $$\gamma_{xy} = \frac{\partial u_x}{\partial y} + \frac{\partial u_y}{\partial x}.$$

Scale features arranged in both the longitudinal (x) and lateral (y) directions can be used, along with compatible energy source/sensor combinations, to measure longitudinal and lateral deformations of the web. These deformations may be used to calculate linear strain along the x and y axis as well as angular or shear strain.

In one application, measured deformation of the web may be used to calculate the modulus of elasticity. The modulus may be calculated as $\lambda = stress/strain$. Thus, using a known force and measuring web strain as described above, the modulus of elasticity of the web may be determined.

The TIR scale features may be formed in or on the substrate by various techniques. For example, the scale features may be deposited or otherwise formed on the substrate by a cast and cure process. Alternatively, the scale features may be formed by embossing, scribing, ablating, printing or other techniques.

A method for forming a TIR scale on a substrate involves the use of a roller that includes the TIR scale features of the scale in negative relief. For example, the roller may include a pattern in negative relief of the scale features illustrated in FIGS. 2F-2G or other configurations. Where longitudinal and lateral scale features are used, the roller may be constructed to provide simultaneous formation of the longitudinal and lateral scale features.

The roller makes contact or is held in close proximity with the substrate and is rotated to form the TIR scale features on the substrate. A material used to form TIR features may be deposited on the substrate and rotation of the roller forms the TIR features in the material on the substrate. Alternatively or additionally, the material may be deposited on the roller and then transferred from the roller to the substrate to accomplish formation of the features. The material may include a resin, a castable polymer or a curable liquid, such as a UV or thermally curable material, for example.

In some implementations, the roller may additionally include pattern features in negative relief. When the roller makes contact or is held in close proximity with the substrate and rotated, the pattern features are concurrently formed on the surface of the substrate along with the scale features. In other implementations, first and second rollers are used, the first roller comprising the scale features in negative relief and the second roller having the negative relief pattern features. The scale features and the pattern features may be concurrently or sequentially formed on the substrate using the first and second rollers.

In yet a further implementation, a first roller is used to form the scale features and a first set of pattern features on a surface of the substrate. A second roller is used to form a second set of pattern features on the substrate, such as on an opposite surface of the substrate. In this implementation, the scale features may be used determine web position to facilitate formation of the second set of pattern features in registration with the first set of pattern features.

Figure 6:
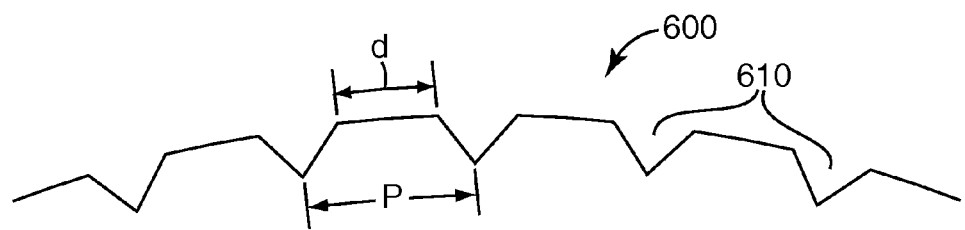
FIG. 6 shows a side view of a portion of a roller having TIR features in negative relief that may be used to form a TIR scale on a substrate in accordance with embodiments of the disclosure.

FIG. 6 shows a side view of a portion of a roller 600 having TIR features in negative relief 610 that may be used to form a TIR scale on a substrate. Note that the dimensions of this roller are greatly exaggerated to facilitate illustration of the roller. In this example, the pitch, p, of the TIR feature peaks is about 40 μm and the distance, d, between the features is about 20 μm, although other values for p and d may be used.

Note that although not shown, the roller 600 may additionally include pattern features in negative relief. Operation of the roller concurrently forms the scale and pattern features on the web as described herein.

Figure 7:
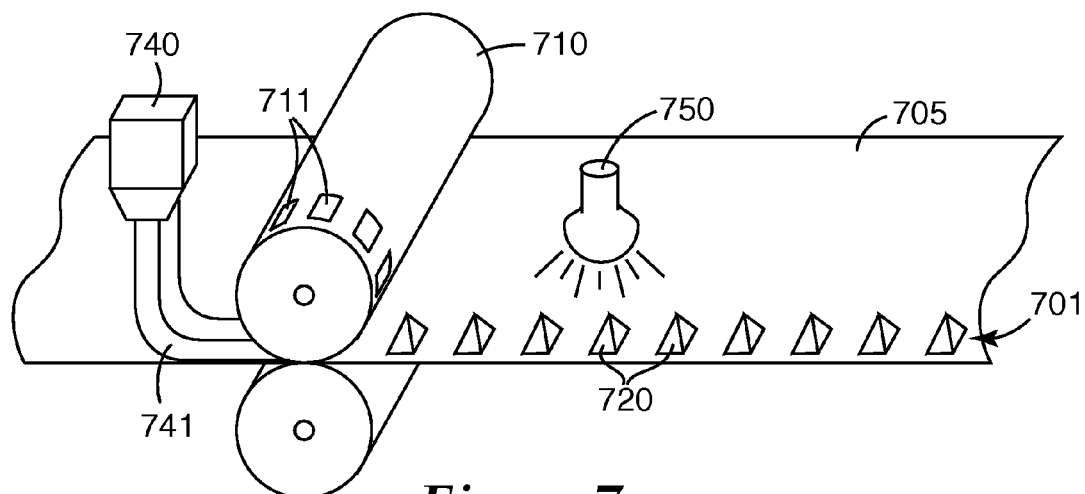
FIG. 7 illustrates a system for forming a scale comprising TIR prism features on a substrate in accordance with embodiments of the disclosure.

FIG. 7 illustrates a system for forming a scale 701 comprising TIR prism features 720 on a substrate 705. The system includes a roller 710 having the TIR scale features in negative relief 711. The roller 710 is configured to be rotated when in contact or in close proximity to the substrate 705. Rotation of the roller 710 forms the TIR prism features 720 of the scale on the substrate 705.

In some configurations, a curable material 741 is dispensed from a dispenser 740 onto the surface of the substrate 705. The roller 710 rotates to form the TIR prism features in the material 741. Optionally, the system may include a curing station 750 that includes an energy source configured to emit a curing energy, such as ultraviolet light, heat, or other curing energy which cures the material 741 on the substrate 705.

Figure 8:
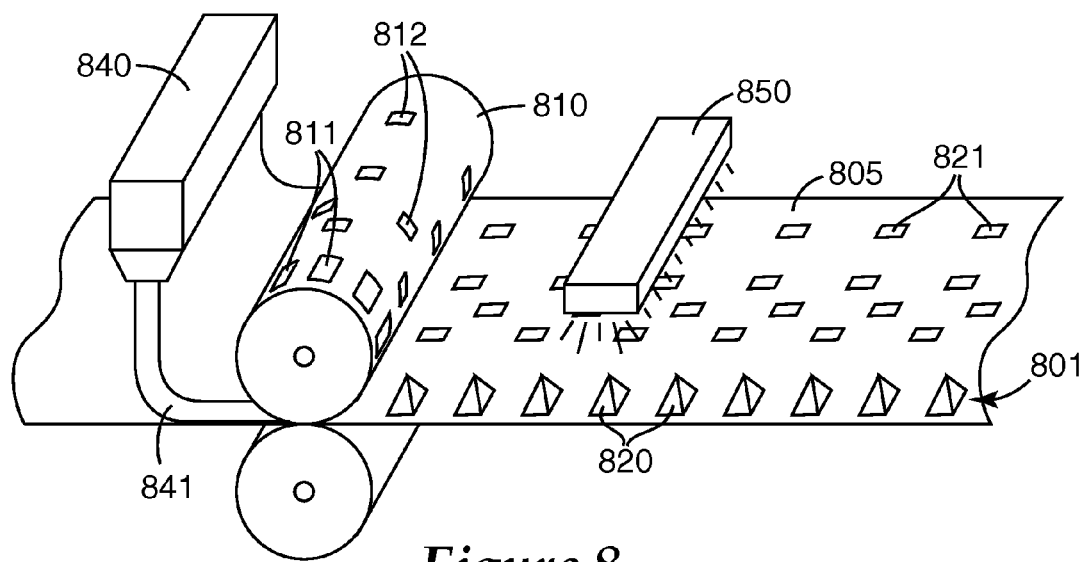
FIG. 8 illustrates a system for concurrently forming a scale comprising TIR prism features and a first layer of pattern features on a substrate in accordance with embodiments of the disclosure.

The diagram of FIG. 8 shows an alternate embodiment of a system for depositing a TIR scale 801 onto a substrate 805. In this embodiment, the roller 810 includes both TIR scale features 811 and pattern features 812 in negative relief. Rotation of the roller 810 in contact or close proximity with the substrate 805 concurrently forms the TIR scale features 820 and the pattern features 821 on the substrate 805.

In the embodiment shown in FIG. 8, the TIR prisms 820 and the pattern features 821 are formed of the same material 841. A dispenser 840 dispenses the material 841 onto the surface of the substrate 805. The roller rotates to form the TIR prism features in the material 841. Optionally, the system may include a curing station 850 that includes an energy source configured to emit a curing energy, such as ultraviolet light, heat, or other energy which cures the material 841 on the substrate 805.

In some configurations, the material used to form TIR scale features and the pattern features may differ. In these configurations, separate material dispensers and/or curing stations may be used.

Figure 9:
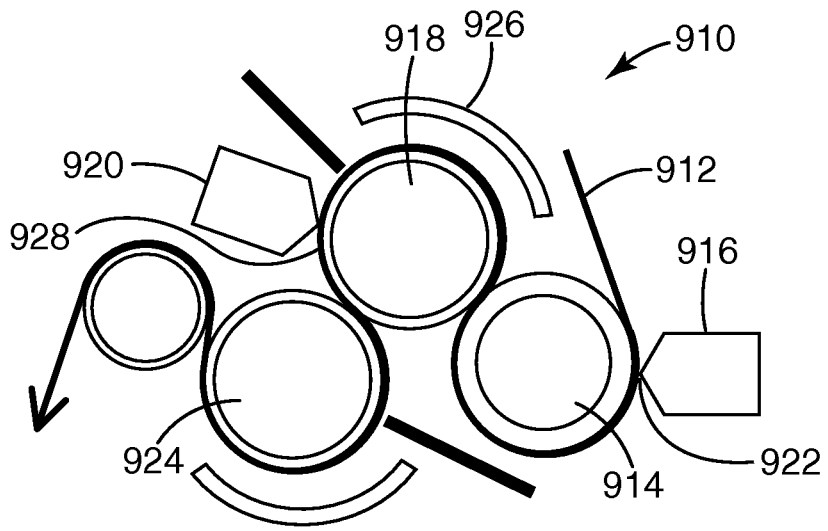
FIG. 9 illustrates a system for producing a two-sided web substrate that includes features on opposing surfaces of the web in accordance with embodiments of the disclosure.

FIG. 9 illustrates an example system 910 for producing a two-sided web substrate 912 that includes features on opposing surfaces of the web. For example, a scale and a first set of pattern features may be formed on a first surface of the web with a second set of pattern features formed on an opposing surface of the web. In some configurations, the system includes first and second dispensers 916, 920, a nip roller 914, and first and second patterned rollers 918, 924. In some instances, the first dispenser 916 may be a first extrusion die 916 while the second dispenser 920 may be a second extrusion die 920.

In the illustrated embodiment, the first material 922 is disposed on a web surface before coming into contact with the first patterned roller 918 and the second material 928 is disposed on an opposing web surface before coming into contact with the second patterned roller 924. In other embodiments, the first material is disposed on the first patterned roller and/or the second material is disposed on the second patterned roller. In these embodiments, the first and second materials are transferred to the web from the patterned rollers.

In one implementation, the first extrusion die 916, dispenses a first curable liquid layer coating 922 onto a first surface of the web 912. Nip roller 914 presses first material 922 into the first patterned roller 918 to form features on the surface of the web. For example, the first patterned roller 918 is patterned with TIR scale features and a first set of pattern features in negative relief. In some cases, nip roller 914 can be a rubber covered roller. As the web passes between the first patterned roller 918 and the nip roller 914, the TIR prism features and the first set of pattern features are formed in the first material 922 on the first surface of the web 912. The first material 922 is cured using an energy source 926 that provides suitable curing energy. In some instances, the energy source 926 may provide ultraviolet light, e.g., light having a wavelength in a range from about 200 to about 500 nanometers.

A second curable liquid layer 928 is coated on the opposite side of the web 912 using a second extrusion die 920. The second layer 928 is pressed into the second patterned roller 924 which is patterned with a second set of pattern features in negative relief. As the web 912 passes between the first pattern roller 918 and the second patterned roller 924, the second set of pattern features are transferred to the second layer 928. The curing process is repeated for the second coating layer 928.

In some configurations, the scale formed by the TIR prisms on the first surface of the web 912 may be used to provide alignment between the first and second sets of pattern features which are formed on opposing sides of the web.

Figure 10:
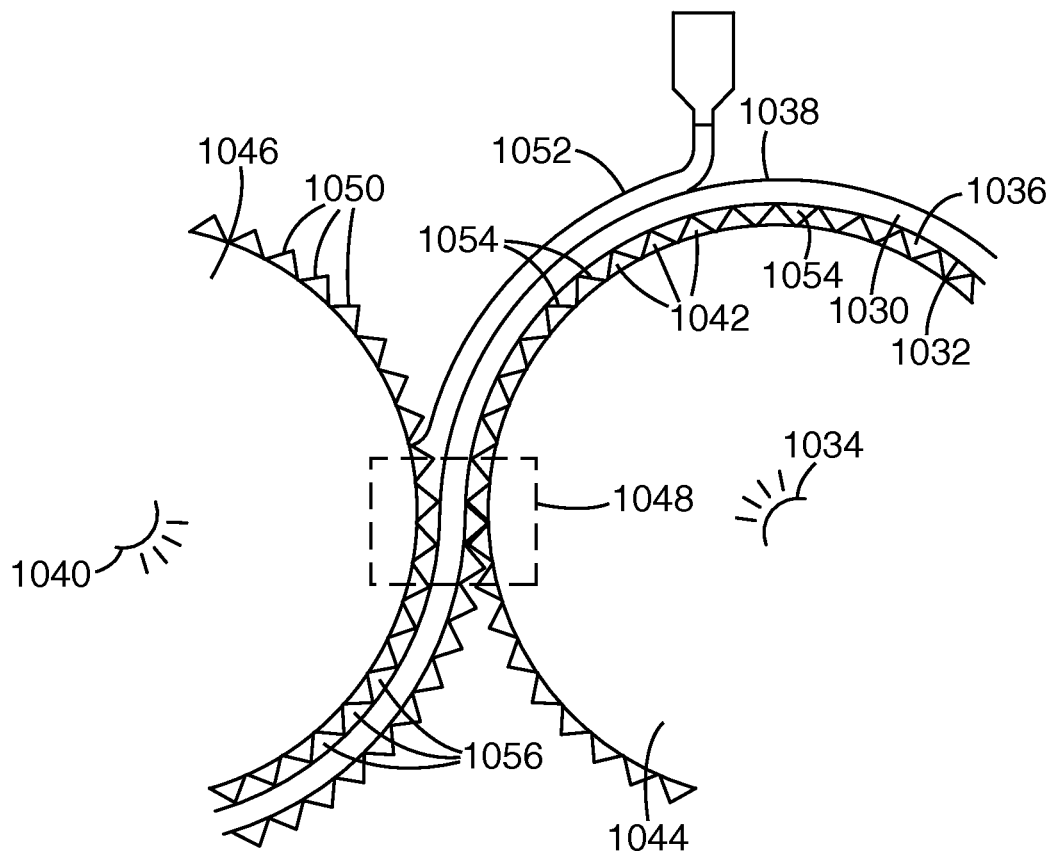
FIG. 10 illustrates first and second patterned rollers that may be used for producing a two-sided web substrate that includes features on opposing surfaces of the web in accordance with embodiments of the disclosure.

FIG. 10 provides a closer view of first and second patterned rollers 1044 and 1046. First and second patterned rollers 1044, 1046 may be considered as particular embodiments of patterned rolls 918, 924 as discussed with respect to FIG. 9. First patterned roll 1044 includes both TIR scale features 1042 and a first set of pattern features in negative relief. Second pattern roller 1046 has a second set of pattern features 1050.

As a web 1030 passes over the first patterned roller 1044, a first curable liquid which is deposited on a first surface 1032 of the web 1030 may be cured by curing energy provided by an energy source 1034 near a first region 1036 on the first patterned roller 1044. The TIR scale features 1054 and the first set of pattern features are formed on the first side 1043 of the web 1030 and the liquid is cured.

After the TIR scale features 1054 and the first set of pattern features are formed, a second curable liquid 1052 is dispensed onto a second surface 1038 of the web 1030. To insure that the second liquid 1052 is not cured prematurely, the second liquid 1052 is isolated from the first energy source 1034, typically by locating the first energy source 1034 so that energy emitted by the first energy source 1034 does not fall on the second liquid 1052. If desired, the curing sources 1034, 1040 can be located inside their respective patterned rollers 1044, 1046.

After the TIR scale features 1054 and first pattern features are formed, the web 1030 continues along the first roll 1044. The movement of the web 1030 may be controlled using the previously deposited TIR scale. The movement of the web continues until it enters a gap region 1048 between the first and second patterned rollers 1044, 1046. The second liquid 1052 is then disposed on the second surface of the web and is formed by the second patterned roller 1046 into the second set of pattern features. The second pattern features are cured by curing energy emitted by a second energy source 1040. As the web 1030 passes into the gap 1048 between first and second patterned rollers 1044, 1046, the TIR scale features 1054 and first patterned features, which are by this time substantially cured and bonded to the web 1030, restrain the web 1030 from slipping while the web 1030 begins moving into the gap 1048 and around the second patterned roller 1046. This decreases web stretching and slippages as a source of registration error between the features formed on opposite sides 1032, 1038 of the web 1030

By supporting the web 1030 on the first patterned roller 1044 while the second liquid 1052 comes into contact with the second patterned roll 1046, the degree of registration between the features 1054, 1056 formed on opposite sides 1032, 1038 of the web 1030 becomes a function of controlling the positional relationship between the surfaces of the first and second patterned rollers 1044, 1046. The S-wrap of the web around the first and second patterned rollers 1044, 1046 and between the gap 1048 formed by the rollers minimizes effects of tension, web strain changes, temperature, microslip caused by mechanics of nipping a web, and lateral position control. The S-wrap can maintain the web 1030 in contact with each roll over a wrap angle of 180 degrees, though the wrap angle can be more or less depending on the particular requirements. Additional aspects of forming features on opposite sides of a web which are applicable to embodiments of the present disclosure are described in commonly owned U.S. Patent Publication 20060210714 which is incorporated herein by reference.

Figure 11:
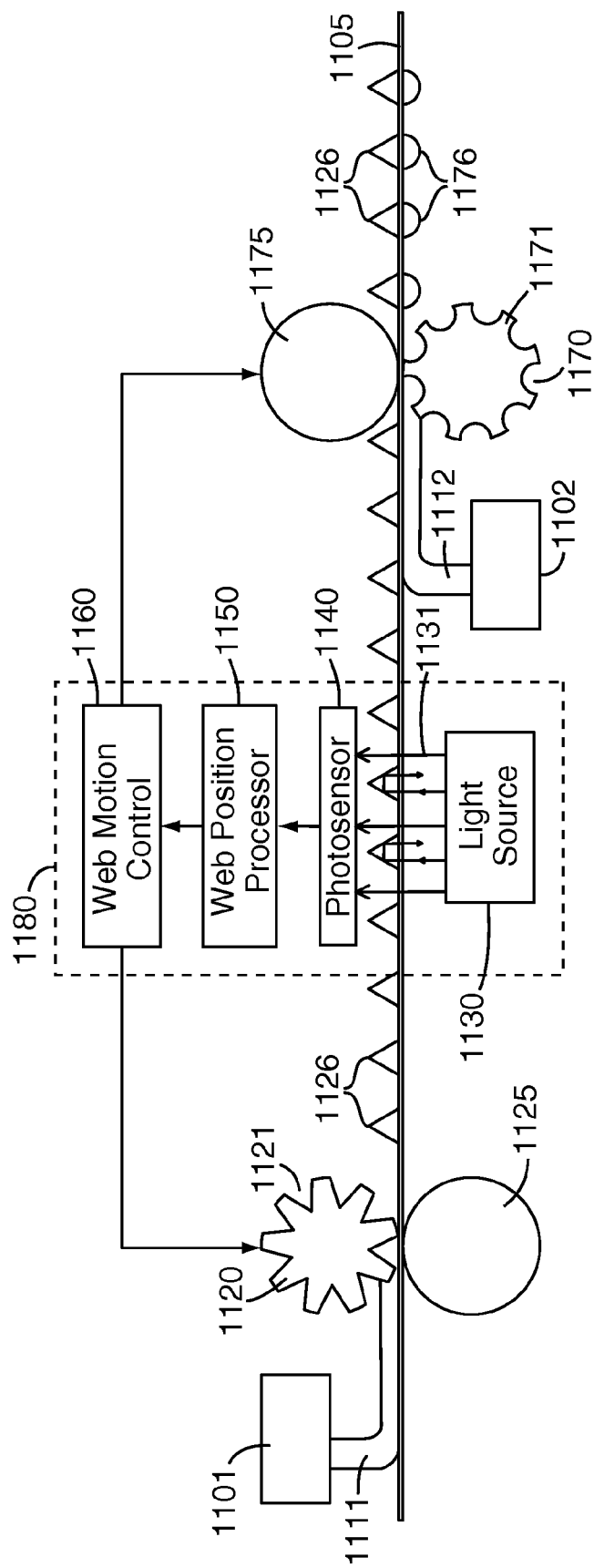
FIG. 11 shows a system wherein the TIR scale formed in a previous manufacturing step is used to control the position of the substrate during a subsequent manufacturing step in accordance with embodiments of the disclosure.

In some implementations, the TIR scale formed in a previous manufacturing step may be used to control the position of the substrate during a subsequent manufacturing step. Such an implementation is shown in FIG. 11, wherein the TIR scale features and pattern features are greatly exaggerated for purposes of illustration. A first dispenser 1101 deposits a first layer of material 1111 onto the surface of a transparent web 1105. The web 1105 having the first layer of material 1111 deposited thereon is brought into contact with a roller 1120 having TIR scale features in negative relief 1121 and first pattern features in negative relief (not shown). As the web 1105 passes between the first patterned roller 1120 and a first nip roller 1125, the TIR scale features 1126 and the first pattern features (not shown) are formed in the first layer of material 1111 on the web 1105.

After formation of a scale comprising the TIR scale features 1126, the scale is used to control the position of the web 1105 during a subsequent processing step. A light source 1130 directs light 1131 toward the TIR scale features 1126. The light is modulated by the TIR scale features 1126. The modulated light is sensed by photosensor 1140 which produces an output signal indicative of web displacement. The photosensor 1140 averages the light modulated by the patterns in view. A web position processor 1150 uses the photosensor output to determine web position. Web motion controller 1160 uses information from the web position processor 1150 to control the down web and/or cross web position of the web 1105 to facilitate alignment between the first pattern features and second pattern features.

In a subsequent processing step, second pattern features are formed on the web. For example, the second pattern features 1176 may be formed on a surface of the web opposite the surface on which the TIR scale elements 1126 are formed. A second dispenser 1102 deposits a second layer of material 1112 on the web 1105. The web 1105 having the second layer of material 1112 disposed thereon passes between a second pattern roller 1170 and a second nip roller 1175. The second pattern roller 1171 includes second pattern features in negative relief 1171. As the web 1105 passes between the second pattern roller 1171 and the second nip roller 1175, the second pattern features 1176 are formed in the second material layer 1112. The motion control components 1180 including the encoder (light source 1130, TIR scale 1126 and photosensor 1140), the web position processor 1150, and web motion controller 1160 maintain alignment between the first pattern features (not shown) and the second pattern features 1176.

The TIR scale described herein can be used to form an encoder that provides alignment for features formed on both sides of a substrate, web tension control, web steering and enhanced converting operations. The TIR scale features can be produced at high speed on a flexible web, and do not require coating to function. Thus, the TIR scale features may be used to determine web displacement as soon as the features are formed without a second coating step.

Further optional subsequent processing steps can also be utilized. An exemplary processing step could include applying higher tension to the web after curing a material that has been applied to the web. Similarly, another exemplary processing step can include wrapping a roll after the curing of an applied feature; such wrapping can include more stretch to the web and the features formed thereon. Such optional processing steps can be advantageous to minimize any contraction of the web caused by non-uniform stress exerted on the web in the area of the features. Such contraction can lead to web buckling or the formation of small wrinkles; optional steps, such as those discussed above, can minimize any buckling or wrinkling that may occur. One of skill in the art would know, having read this specification, how to effectuate such optional process steps.

Figure 12:
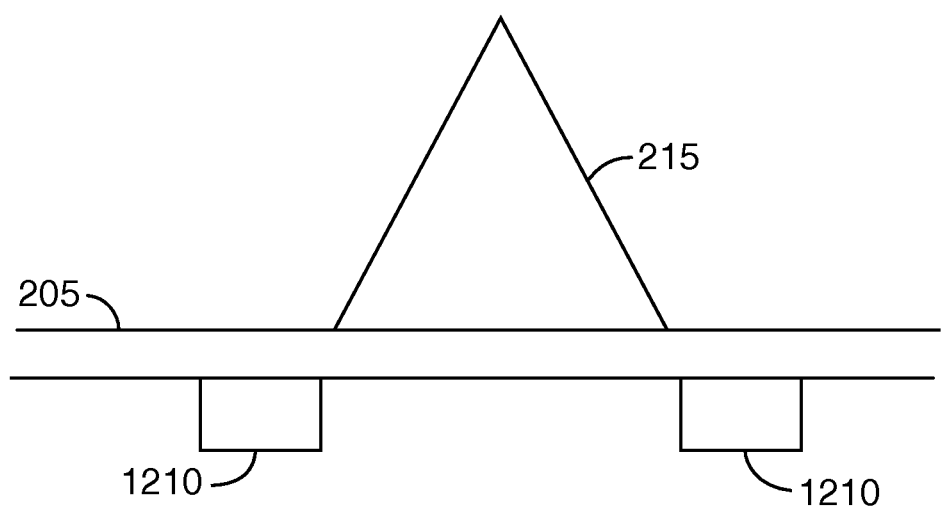
FIG. 12 illustrate scale features arranged longitudinally on one surface of a web and a second pattern on the back side of the web in accordance with embodiments of the disclosure.

Another method of minimizing any buckling or wrinkling could include the use of secondary structures on the back side of the web. An exemplary type of structures would be one that would compensate or negate the tendency of the web to buckle. An example of such a structure can be seen in FIG. 12. As seen in FIG. 12, the web 205 includes optical scale features 215 that are flanked (in this exemplary embodiment) by smaller structures, referred to herein as backside pattern features 1210.

One of skill in the art, having read this specification, will understand that such a web, including backside features (as exemplified in FIG. 12) can be made according to the exemplary method discussed with respect to FIG. 11, for example.

The foregoing description of the various embodiments of the disclosure has been presented for the purposes of illustration and description. It is not intended to be exhaustive or to limit the disclosure to the precise form disclosed. Many modifications and variations are possible in light of the above teaching. It is intended that the scope of the disclosure be limited not by this detailed description, but rather by the claims appended hereto.

What is claimed is:

1. A system comprising:
   one or more rollers having a plurality of total internal reflection (TIR) prism features in negative relief;
   a substrate having a major surface, the one or more rollers being rotatable when in contact or in close proximity to the substrate;
   a displacement scale comprising a plurality of TIR prisms formed on the major surface of the substrate, the TIR prisms corresponding to the TIR prism features in negative relief of the one or more rollers, each of the TIR prisms being discrete and disconnected with each other along a longitudinal direction of the substrate;
   a light source to direct light toward the displacement scale on the substrate;
   one or more photosensors positioned to receive light from the substrate; and
   a reticle positioned adjacent to the displacement scale on the substrate, the reticle including at least one reticle window and at least one light blocking region adjacent to the at least one reticle window,
   wherein the plurality of TIR prisms are configured to reflect a portion of the light directed from the light source, and
   wherein the substrate is movable relative to the light source and the reticle such that the displacement scale on the substrate and the reticle are capable of modulating the light received by the one or more photosensors to generate an output signal, and a position processor is configured to receive the output signal and determine the position of the substrate.

2. The system of claim 1, wherein the one or more rollers further have a plurality of first pattern features in negative relief and rotation of the one or more rollers simultaneously forms the displacement scale and a plurality of first pattern features on the substrate.

3. The system of claim 1, further comprising a dispenser configured to dispense a material on the major surface of the substrate and wherein rotation of the one or more rollers forms the displacement scale comprising the TIR prisms in the material on the substrate.

4. The system of claim 3, wherein the material comprises an ultraviolet (UV) curable resin.

5. The system of claim 3, wherein the material comprises a castable polymer.

6. The system of claim 3, wherein the material comprises a curable material.

7. The system of claim 3, further comprising a curing station configured to cure the TIR prisms.

8. The system of claim 7, wherein the curing station comprises a UV light source.

9. The system of claim 7, wherein:
   the material comprises a thermally curable material; and
   the curing station comprises a heat source.

10. The system of claim 2, further comprising:
    one or more additional rollers each including one or more second pattern features in negative relief, the one or more additional rollers being rotatable when in contact or in close proximity to the substrate to form a plurality of second pattern features on the substrate, the plurality of second pattern features corresponding to the second pattern features in negative relief of the one or more additional rollers.

11. The system of claim 2, wherein the plurality of first pattern features are formed simultaneously with the formation of the displacement scale.

12. The system of claim 10, wherein
    the displacement scale is configured to facilitate transfer of the plurality of second pattern features in registration with the plurality of first pattern features.

13. The system of claim 1, wherein the substrate comprises a flexible web.

14. The system of claim 1, wherein the substrate comprises a rigid material.

15. The system of claim 1, wherein the substrate comprises a polymer.

16. The system of claim 1, wherein the displacement scale further comprises a second set of TIR prisms configured to measure lateral displacement.

17. The system of claim 1, wherein the displacement scale is configured to measure angular displacement.

18. A method of forming a displacement scale comprising TIR prisms on a flexible substrate, comprising:
    bringing the substrate into contact or close proximity with one or more rollers having total internal reflection (TIR) prism features in negative relief;
    rotating the one or more rollers relative to the substrate so that a displacement scale comprising a plurality of TIR prisms is formed on a surface of the flexible substrate, the plurality of TIR prisms being discrete and disconnected with each other along a longitudinal direction of the substrate;
    providing a reticle adjacent to the displacement scale on the substrate and between the substrate and one or more photosensors, the reticle including at least one reticle window and at least one light blocking region adjacent to the at least one reticle window;
    directing light, via a light source, toward the flexible substrate having the plurality of TIR prisms, wherein the plurality of TIR prisms are configured to reflect a portion of the light, and the light is modulated by the plurality of TIR prisms and the reticle;
    sensing, via the one or more photosensors, the modulated light to generate an output signal;
    receiving, via a position processor, the output signal; and
    determining the position of the flexible substrate,
    wherein the substrate is movable relative to the light source and the reticle such that the displacement scale on the substrate and the reticle are capable of modulating the light received by the one or more photosensors.

19. The method of claim 18, further comprising:
    dispensing a material on the substrate surface; and
    wherein the rotating the one or more rollers so that the displacement scale is formed comprises rotating the one or more rollers so that the TIR prisms are formed in the material.

20. The method of claim 18, further comprising forming a plurality of first pattern features on the substrate concurrently with formation of the TIR prisms.

21. The method of claim 20, further comprising:
depositing an additional material on an opposite major surface of the substrate or on one or more additional rollers to form a plurality of second pattern features, the one or more additional rollers having a plurality of second pattern features in negative relief;
bringing the substrate in contact or close proximity with the one or more additional rollers; and
forming, on the opposite major surface of the substrate, the plurality of second pattern features.

22. The method of claim 21, further comprising maintaining registration between the plurality of first pattern features and the plurality of second pattern features using the displacement scale.

23. A system comprising:
a roller having total internal reflection (TIR) features in negative relief and pattern features in negative relief, the TIR features in negative relief including a plurality of prisms in negative relief,
the roller configured to simultaneously form a scale, comprising a plurality of TIR features and pattern features on a substrate when the roller is brought into contact or close proximity with the substrate, the TIR features including a plurality of prisms corresponding to the plurality of prisms in negative relief of the roller, the plurality of prisms being configured to reflect a portion of light directed toward the scale on the substrate, the adjacent prisms on the substrate being separated by a distance d along a longitudinal direction of the substrate, and the adjacent prisms on the substrate having respective peaks with a distance p therebetween along the longitudinal direction; and
a reticle positioned adjacent to the scale on the substrate, the reticle including at least one reticle window and at least one light blocking region,
wherein the substrate is movable relative to the reticle.

24. The system of claim 23, wherein the plurality of prisms comprise right regular prisms.

25. The system of claim 23, wherein the scale further comprises a second set of features configured to measure lateral displacement, and the scale forms a checkerboard pattern.

26. The system of claim 23, wherein the distance p between the peaks of the adjacent prisms is about 40 μm.

27. The system of claim 23, wherein the distance d between the adjacent prisms is about 20 μm.

28. The system of claim 23, further comprising a light source to direct light toward the scale on the substrate, wherein the reticle window allows a portion of the light directed toward the substrate to pass through the reticle, and the light block region is configured to block a portion of the light.

* * * * *